United States Patent
Yang et al.

(10) Patent No.: US 9,276,016 B2
(45) Date of Patent: Mar. 1, 2016

(54) ARRAY SUBSTRATE INCLUDING OXIDE THIN FILM TRANSISTOR AND METHOD OF FABRICATING THE SAME

(71) Applicant: LG Display Co., Ltd., Seoul (KR)

(72) Inventors: Hee-Jung Yang, Yangju-si (KR); Dong-Sun Kim, Goyang-si (KR); Won-Joon Ho, Jeonju-si (KR); A-Ra Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/542,909

(22) Filed: Nov. 17, 2014

(65) Prior Publication Data
US 2015/0144944 A1 May 28, 2015

(30) Foreign Application Priority Data
Nov. 25, 2013 (KR) .................. 10-2013-0143734

(51) Int. Cl.
*H01L 27/12* (2006.01)
*H01L 29/786* (2006.01)
*H01L 29/49* (2006.01)
*H01L 21/28* (2006.01)

(52) U.S. Cl.
CPC ........ *H01L 27/124* (2013.01); *H01L 21/28008* (2013.01); *H01L 27/1225* (2013.01); *H01L 27/1259* (2013.01); *H01L 29/4908* (2013.01); *H01L 29/7869* (2013.01)

(58) Field of Classification Search
None
See application file for complete search history.

(56) References Cited

U.S. PATENT DOCUMENTS

2006/0278606 A1* 12/2006 Park .................. C23F 1/30
216/28

OTHER PUBLICATIONS

Wei, H.L. et al., "Development of <110> texture in copper thin films," *Applied Physics Letters*, Apr. 1, 2002, pp. 2290-2292, vol. 80, No. 13.

* cited by examiner

*Primary Examiner* — Matthew Reames
*Assistant Examiner* — Steven B Gauthier
(74) *Attorney, Agent, or Firm* — Fenwick & West LLP

(57) ABSTRACT

An array substrate including: a gate barrier layer on a substrate; a gate line on the gate barrier layer, the gate line having a gate open portion exposing the gate barrier layer in a gate electrode region; a gate insulating layer on the gate line; an active layer on the gate insulating layer over the gate barrier layer in the gate electrode region; and source and drain electrodes spaced apart from each other on the active layer.

10 Claims, 6 Drawing Sheets

ARRAY SUBSTRATE INCLUDING OXIDE THIN FILM TRANSISTOR AND METHOD OF FABRICATING THE SAME

CROSS-REFERENCE TO RELATED APPLICATION

This application claims the benefit under 35 U.S.C. §119 (a) of Korean Patent Application No. 10-2013-0143734, filed on Nov. 25, 2013, in the Korean Intellectual Property Office, which is incorporated herein by reference in its entirety.

BACKGROUND

1. Technical Field

The present disclosure relates to an array substrate, and more particularly, to an array substrate including an oxide thin film transistor and a method of fabricating the same.

2. Discussion of the Related Art

Recently, as the information society progresses, display devices processing and displaying a large amount of information have rapidly advanced and various flat panel displays (FPDs) have been developed. Specifically, the FPDs such as a liquid crystal display (LCD) device, a plasma display panel (PDP) device, an organic light emitting diode (OLED) display device and a field emission display (FED) device having a superior performance with a thin profile, a light weight, and a low power consumption have substituted for a cathode ray tube (CRT).

Among various FPDs, the LCD device having a high contrast ratio, an advantage in displaying a moving image and a low power consumption has been used in various fields such as a notebook, a monitor and a television. The LCD device uses an optical anisotropy and a polarization property of a liquid crystal molecule.

In addition, the OLED display device has superior properties such as a high brightness and an ability to be driven by a low voltage. Since the OLED display device is an emissive type, the OLED display device has a high contrast ratio and a thin profile. The OLED display device has an advantage in displaying a moving image due to a short response time of several micro seconds (μsec). The OLED display device has no limitation on a viewing angle and is stable even in a low temperature.

The LCD device and the OLED display device include an array substrate having a thin film transistor (TFT) for turning on and off a pixel region. In general, the TFT is formed by using a semiconductor material such as amorphous silicon.

Recently, as size and resolution of the FPD increase, a TFT having a faster processing speed, more stable operation and durability is required. However, since the TFT using amorphous silicon has a charge carrier mobility smaller than about 1 $cm^2$/Vsec, the TFT using amorphous silicon has a limit for application to the FPD having a great size and a high resolution.

Accordingly, an oxide TFT where an active layer is formed of an oxide semiconductor material having a high mobility and a uniform current property has been widely researched.

Figure 1:
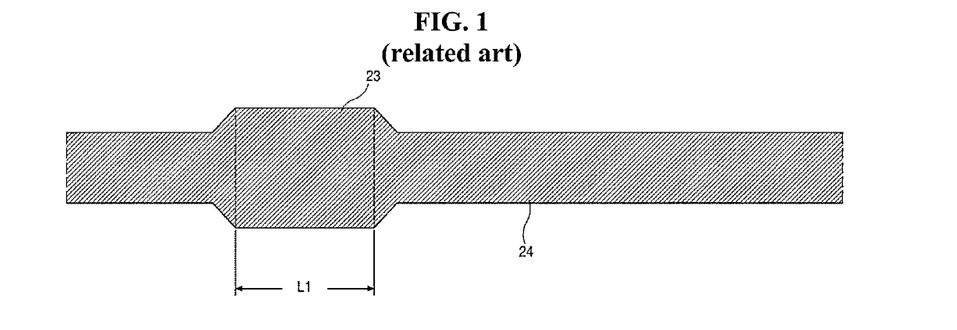
FIG. 1 is a plan view showing a gate line of an array substrate according to the related art.
Figure 2:
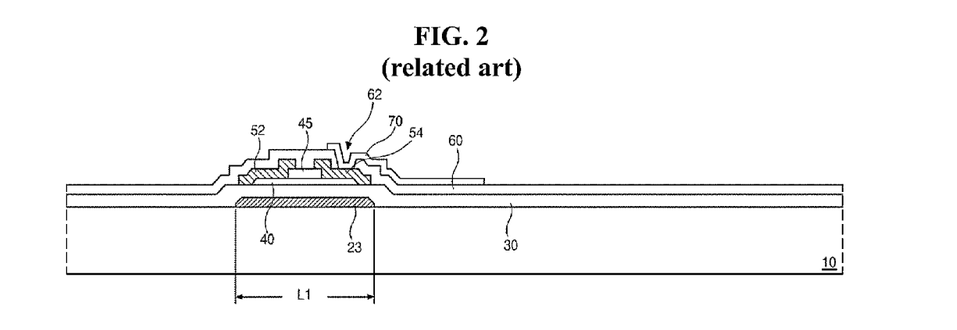
FIG. 2 is a cross-sectional view showing an oxide thin film transistor of an array substrate according to the related art.

FIG. 1 is a plan view showing a gate line of an array substrate according to the related art, and FIG. 2 is a cross-sectional view showing an oxide thin film transistor of an array substrate according to the related art.

In FIGS. 1 and 2, a gate line 24 is formed along a first direction on a substrate 10 and includes a gate electrode 23 corresponding to a gate electrode region L1. A gate insulating layer 30, an active layer 40, an etch stopping layer 45 and source and drain electrodes 52 and 54 are sequentially formed on the gate electrode 23 to constitute an oxide thin film transistor (TFT). In addition, a passivation layer 60 and a pixel electrode 70 are sequentially formed on the oxide TFT. The passivation layer 60 has a drain contact hole 62 exposing the drain electrode 54 and the pixel electrode 70 is connected to the drain electrode 54 through the drain contact hole 62.

The gate line 24 including the gate electrode 23 is formed of copper (Cu) having a relatively low resistance, a relatively high electrical conductivity and a relatively low dielectric constant. Since a plurality of heat treatment processes are performed for fabricating the oxide TFT, grains of copper may grow on a top surface of the gate electrode 23 due to the heat.

Figure 3A:
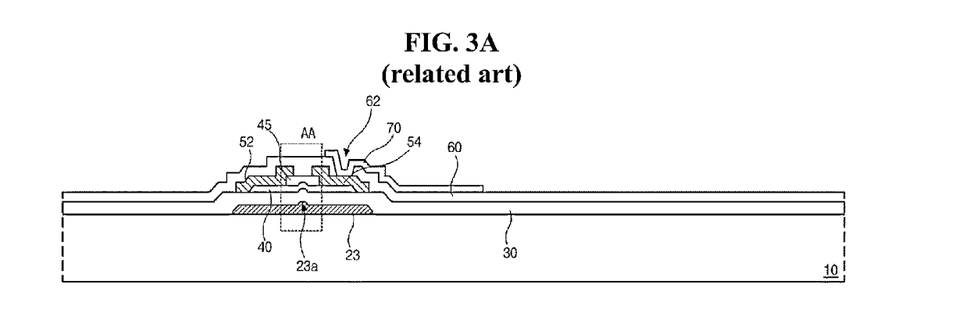
FIG. 3A is a cross-sectional view showing grain growth on a top surface of a gate electrode of an array substrate according to the related art.
Figure 3B:
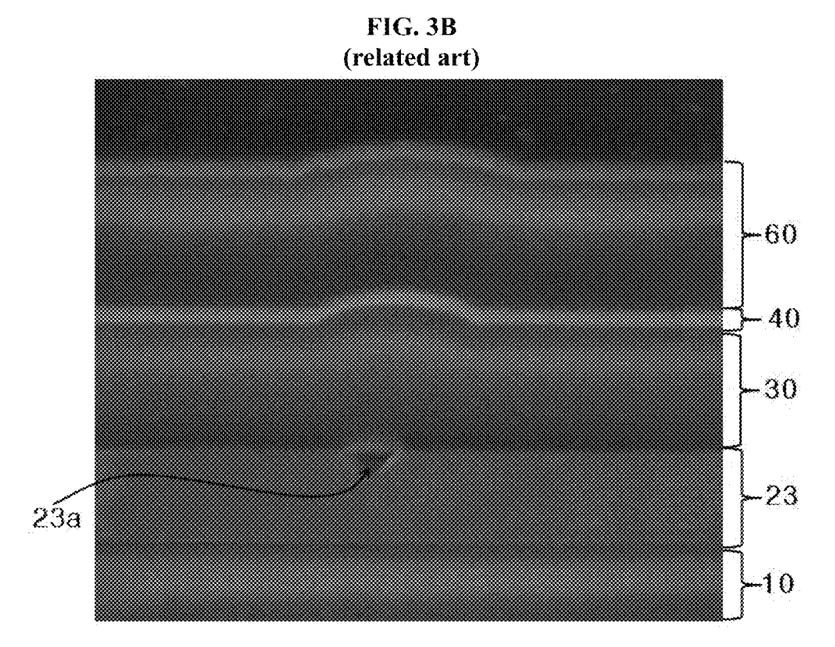
FIG. 3B is a scanning electron microscope image showing a portion AA of FIG. 3A.

FIG. 3A is a cross-sectional view showing grain growth on a top surface of a gate electrode of an array substrate according to the related art, and FIG. 3B is a scanning electron microscope image showing a portion AA of FIG. 3A.

In FIGS. 3A and 3B, a grain grows on a top surface in a central portion of the gate electrode 23 due to the heat. The grain may protrude from the top surface to form a protrusion 23a and a cavity in the gate electrode 23 and the gate line 24. In addition, the protrusion 23a may cause a protrusion of the gate insulating layer 30, the active layer 40 and the passivation layer 60 sequentially on the gate electrode 23 such that the gate insulating layer 30, the active layer 40 and the passivation layer 60 do not have a flat top surface. Since a property of the oxide TFT is deteriorated due to the protrusion, reliability of an array substrate including the oxide TFT is reduced and defect rate of a display device using the array substrate increases.

Further, grain growth and cavity formation may occur in a metal line having a metallic material different from copper (Cu) and an array substrate including the metal line may be deteriorated.

SUMMARY

Embodiments of the present disclosure relate to an array substrate and a method of fabricating the array substrate. Accordingly, one exemplary embodiment is directed to an array substrate that substantially obviates one or more of the problems due to limitations and disadvantages of the related art.

One exemplary embodiment is an array substrate, where a gate electrode includes a gate open portion and a gate barrier layer is exposed through the gate open portion so that grain growth and cavity formation in the gate electrode can be prevented, and a method of fabricating the array substrate.

In addition, one exemplary embodiment is an array substrate, where source and drain electrodes are removed and a data barrier layer and a drain barrier layer are exposed through a source open portion and a drain open portion, respectively, so that grain growth and cavity formation in the source and drain electrodes can be prevented, and a method of fabricating the array substrate.

Further, one exemplary embodiment is an array substrate including an oxide thin film transistor, where reliability is improved and deterioration is prevented, and a method of fabricating the array substrate.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

To achieve other advantages and features in accordance with the purpose according to one aspect of the disclosure, one exemplary embodiment is an array substrate including: a gate barrier layer on a substrate; a gate line on the gate barrier layer, the gate line having a gate open portion exposing the gate barrier layer in a gate electrode region; a gate insulating layer on the gate line; an active layer on the gate insulating layer over the gate barrier layer in the gate electrode region; and source and drain electrodes spaced apart from each other on the active layer.

In another aspect, one exemplary embodiment is a method of fabricating an substrate includes: forming a gate barrier layer and gate line sequentially on a substrate, the gate line having a gate open portion exposing the gate barrier layer in a gate electrode region; forming a gate insulating layer on the gate line; forming an active layer on the gate insulating layer over the gate barrier layer in the gate electrode region; and forming source and drain electrodes spaced apart from each other on the active layer.

It is to be understood that both the foregoing general description and the following detailed description are exemplary and explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 4A:
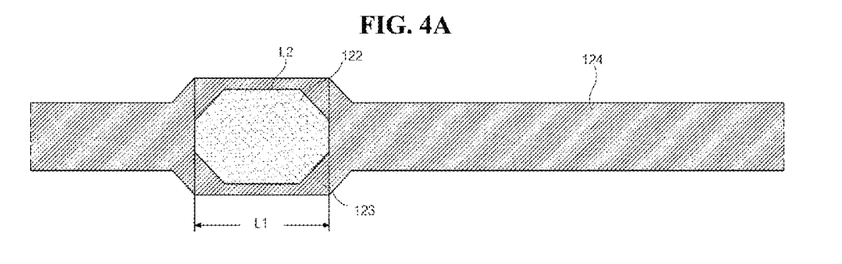
FIG. 4A is a plan view showing a gate line of an array substrate according to a first embodiment of the present disclosure.
Figure 4B:
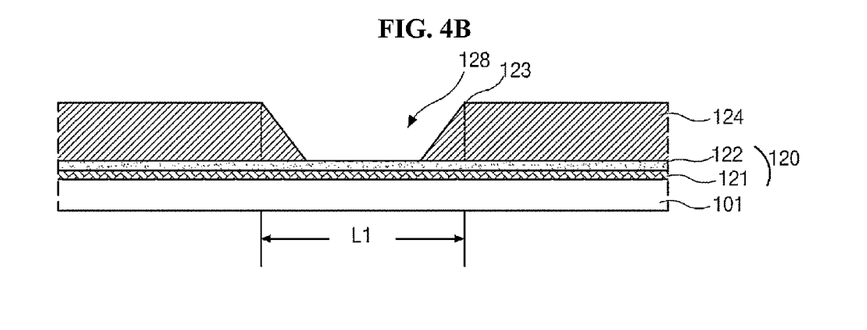
FIG. 4B is a cross-sectional view showing a gate line of an array substrate according to a first embodiment of the present disclosure.
Figure 5:
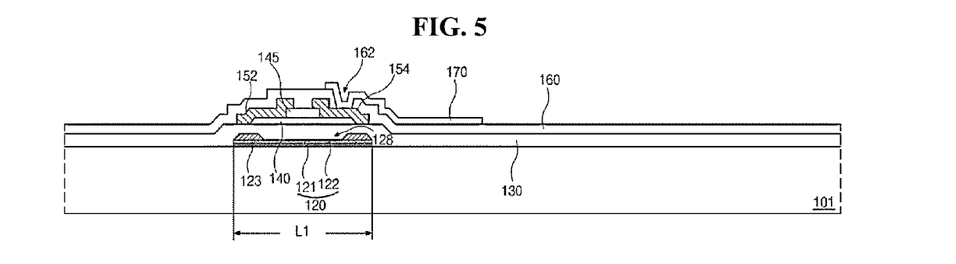
FIG. 5 is a cross-sectional view showing an array substrate according to a first embodiment of the present disclosure.

FIG. 4A is a plan view showing a gate line of an array substrate according to a first embodiment of the present disclosure, FIG. 4B is a cross-sectional view showing a gate line of an array substrate according to a first embodiment of the present disclosure, and FIG. 5 is a cross-sectional view showing an array substrate according to a first embodiment of the present disclosure.

In FIGS. 4A, 4B and 5, a gate barrier layer 120 and a gate line 124 are sequentially formed on a substrate 101. The gate barrier layer 120 and the gate line 124 are disposed along a first direction and the gate line 124 includes a gate electrode 123 corresponding to a gate electrode region L1. The gate electrode 123 includes a gate open portion 128 in the gate electrode region L1 and the gate barrier layer 120 is exposed through the gate open portion 128. The gate line 124 and the gate electrode 123 may include copper (Cu) having a relatively low resistance, a relatively high electrical conductivity and a relatively low dielectric constant.

The gate barrier layer 120 may have a single-layered structure or a multiple-layered structure. In addition, since the gate barrier layer 120 corresponding to the gate electrode region L1 includes a conductive material, the gate barrier layer 120 may function as a gate electrode.

When the gate barrier layer 120 has a single-layered structure, the gate barrier 120 may include a material having a relatively high etching selectivity with respect to the gate electrode 123. For example, the gate barrier layer 120 may be formed of an alloy including at least two of chromium (Cr), silicon (Si), titanium (Ti), molybdenum (Mo), tantalum (Ta) and aluminum (Al). Alternatively, the gate barrier layer 120 may be formed of a material including one of chromium (Cr), silicon (Si), titanium (Ti), molybdenum (Mo), tantalum (Ta) and aluminum (Al) and one of carbon oxide (COx), oxide (Ox) and nitride (Nx).

When the gate barrier layer 120 has a double-layered structure of a first gate layer 121 and a second gate layer 122 on the first gate layer 121 as in FIG. 4B, the first and second gate layers 121 and 122 may include first and second materials, respectively, where a reflectance of the first material is higher than a reflectance of the second material and an etching selectivity of the second material is higher than an etching selectivity of the first material. The first material may have a relatively low transmittance and an excellent surface reformation property. For example, the first gate layer 121 may be formed of one of molybdenum (Mo), titanium (Ti), copper (Cu), aluminum (Al), gold (Au) and silver (Ag) or an alloy including at least one thereof. In addition, the second material may have a relatively high etching selectivity. For example, the second gate layer 122 may be formed of a transparent conductive oxide (TCO) such as indium oxide (InOx), zinc oxide (ZnOx) and tin oxide (SnOx).

Although the first gate layer may be formed on the second gate layer in another embodiment, the second gate layer 122 of the second material of a relatively high etching selectivity with respect to the gate line 124 may be disposed directly under the gate line 124 for the purpose of selectively etching the gate line 124 in the gate electrode region L1. Accordingly, the first gate layer 121 may reflect a light incident to a rear surface of the substrate 101 so that irradiation onto an active layer 140 (of FIG. 5) through the gate open portion 128 in the gate electrode region L1 can be prevented.

In addition, when the gate barrier layer 120 has a triple-layered structure of a first gate layer, a second gate layer on the first gate layer and a third gate layer under the first gate layer, the first to third gate layers may include first to third materials, respectively, where the first material have a relatively low transmittance and an excellent surface reformation property and each of the second and third materials has a relatively high etching selectivity. For example, the first gate layer may be formed of one of molybdenum (Mo), titanium (Ti), copper (Cu), aluminum (Al), gold (Au) and silver (Ag) or an alloy including at least one thereof. In addition, each of the second and third materials may be formed of a transparent conductive oxide (TCO) such as indium oxide (InOx), zinc oxide (ZnOx) and tin oxide (SnOx).

The gate electrode 123 has the gate open portion 128 exposing the gate barrier layer 120 at a central portion of the gate electrode region L1 and is disposed at an edge portion of the gate electrode region L1. Since the gate electrode 123 is formed to avoid the central portion of an oxide thin film transistor (TFT), grain growth and cavity formation in the gate electrode 123 are prevented. In addition, since the gate line 124 is formed on the gate barrier layer 120, a resistance of the gate line 124 is reduced as compared with the related art and signal delay is prevented. The gate barrier layer 120 may be used for a repair process.

Turning to FIG. 5, a gate insulating layer 130 is formed on the gate electrode 123, and an active layer 140 is formed on the gate insulating layer 130 over the gate electrode 123 and the gate barrier 120 layer exposed through the gate open portion 128 in the gate electrode region. The active layer 140 may include an oxide semiconductor material. For example, the active layer 140 may be formed of amorphous indium gallium zinc oxide (a-InGaZnO$_4$: a-IGZO). In addition, an etch stopping layer 145 of an inorganic insulating material such as silicon nitride (SiNx) and silicon oxide (SiO$_2$) is formed on the active layer 140. The etch stopping layer 145 prevents deterioration of the active layer 140 by an etchant. For example, the etch stopping layer 145 may have a width narrower than the active layer 140 and may correspond to a central portion of the active layer 140.

Source and drain electrodes 152 and 154 are formed on the etching stopping layer 145. The source and drain electrodes 152 and 154 are spaced apart from each other and contact both end portions of the active layer 140. Although not shown, the source electrode 152 is connected to a data line crossing the gate line 124. The gate electrode 123, the gate insulating layer 130, the active layer 140, the etching stopping layer 145 and the source and drain electrodes 152 and 154 constitute an oxide thin film transistor (TFT).

A passivation layer 160 is formed on the source and drain electrodes 152 and 154, and a pixel electrode 170 is formed on the passivation layer 160. The passivation layer 160 has a drain contact hole 162 exposing the drain electrode 154 and the pixel electrode 170 is connected to the drain electrode 154 through the drain contact hole 162.

The gate electrode corresponding to the gate electrode region may be completely removed in another embodiment.

Figure 6:
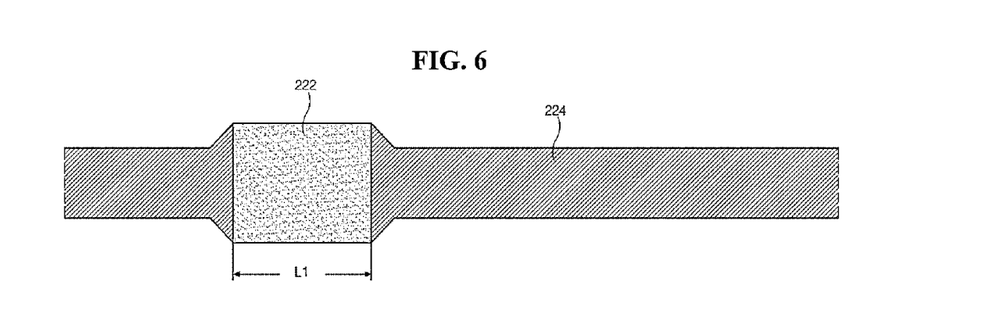
FIG. 6 is a plan view showing a gate line of an array substrate according to a second embodiment of the present disclosure.
Figure 7:
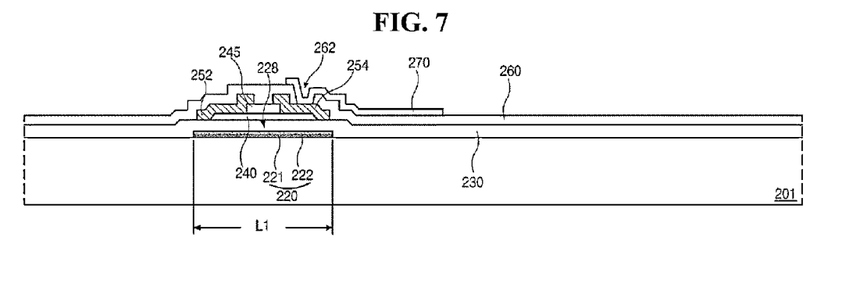
FIG. 7 is a cross-sectional view showing an array substrate according to a second embodiment of the present disclosure.

FIG. 6 is a plan view showing a gate line of an array substrate according to a second embodiment of the present disclosure, and FIG. 7 is a cross-sectional view showing an array substrate according to a second embodiment of the present disclosure. Illustration on a portion of the second embodiment having the same structure as that of the first embodiment will be omitted.

In FIGS. 6 and 7, a gate barrier layer 220 and a gate line 224 are sequentially formed on a substrate 201. The gate barrier layer 220 and the gate line 224 are disposed along a first direction. A portion of the gate line 224 corresponding to a gate electrode region L1 is completely removed to expose the gate barrier layer 220. The gate line 224 includes a gate open portion 228 in the gate electrode region L1 and the gate barrier layer 220 is exposed through the gate open portion 228. The gate line 224 may include copper (Cu) having a relatively low resistance, a relatively high electrical conductivity and a relatively low dielectric constant.

A gate insulating layer 230, an active layer 240, an etch stopping layer 245 and source and drain electrodes 252 and 254 are sequentially formed on the gate barrier layer 220 in the gate electrode region L1 to constitute an oxide thin film transistor (TFT). Since the gate barrier layer 220 exposed through the gate open portion 228 in the gate electrode region L1 includes a conductive material, the gate barrier layer 220 may function as a gate electrode.

FIGS. 8A to 8F are cross-sectional views showing a method of fabricating an array substrate according to a second embodiment of the present disclosure.

Figure 8A:
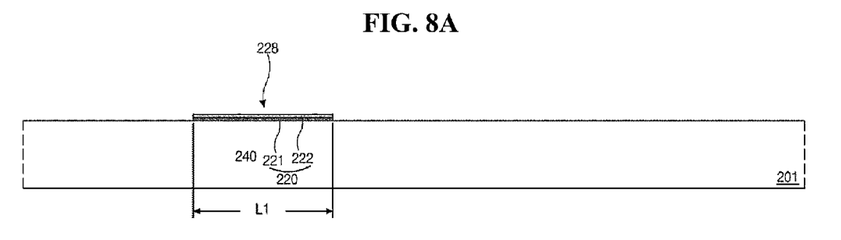
FIGS. 8A to 8F are cross-sectional views showing a method of fabricating an array substrate according to a second embodiment of the present disclosure.

In FIG. 8A, after first and second conductive layers and a first metal layer are sequentially formed on a substrate 201, a gate barrier layer 220 and a gate line 224 (of FIG. 6) are formed by patterning the first and second conductive layers and the first metal layer through a photolithographic process. The gate barrier layer 220 includes first and second gate layers 221 and 222, and the gate line 224 has a gate open portion 228 exposing the second gate layer 222 of the gate barrier layer 220 in a gate electrode region L1.

The substrate 201 may include a plastic having flexibility or a glass. The plastic substrate may be formed of an organic insulating material. For example, the plastic substrate may include one of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), triacetyl cellulose (TAC) and cellulose acetate propionate (CAP).

The first conductive layer for the first gate layer 221 may include a material having a relatively high reflectance. For example, the first conductive layer may be formed of one of molybdenum (Mo), titanium (Ti), copper (Cu), aluminum (Al), gold (Au) and silver (Ag) or an alloy including at least one thereof.

The second conductive layer for the second gate layer 222 may include a material having a relatively high etching selectivity with respect to copper (Cu). For example, the second conductive layer may be formed of a transparent conductive oxide (TCO) such as indium oxide (InOx), zinc oxide (ZnOx) and tin oxide (SnOx).

The first metal layer for the gate line 224 may include one of aluminum (Al), copper (Cu), gold (Au), silver (Ag), titanium (Ti), chromium (Cr), tungsten (W), tantalum (Ta) and molybdenum (Mo). Alternatively, the first metal layer for the gate line 224 may include an alloy having one of aluminum (Al), copper (Cu), gold (Au), silver (Ag), titanium (Ti), chromium (Cr), tungsten (W), tantalum (Ta) and molybdenum (Mo) and at least one of calcium (Ca), magnesium (Mg), zinc (Zn), titanium (Ti), molybdenum (Mo), nickel (Ni), manganese (Mn), zirconium (Zr), cadmium (Cd), gold (Au), silver (Ag), cobalt (Co), indium (In), tantalum (Ta), hafnium (Hf), tungsten (W) and chromium (Cr).

Figure 8B:
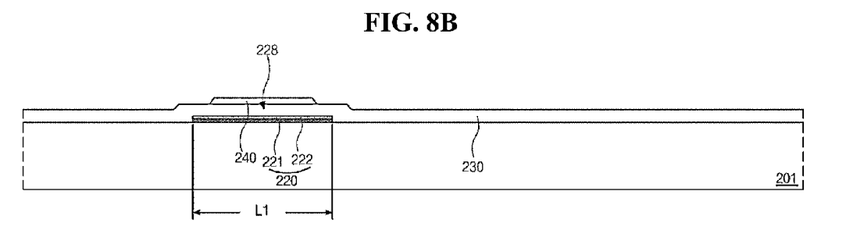

In FIG. 8B, a gate insulating layer 230 of an insulating material is formed on an entire surface of the substrate 201 having the gate barrier layer 220 and the gate line 240. In addition, after an oxide semiconductor layer of an oxide semiconductor material is formed on the gate insulating layer 230, an active layer 240 is formed on the gate insulating layer 230 in the gate electrode region L1 by patterning the oxide semiconductor layer through a photolithographic process.

Figure 8C:
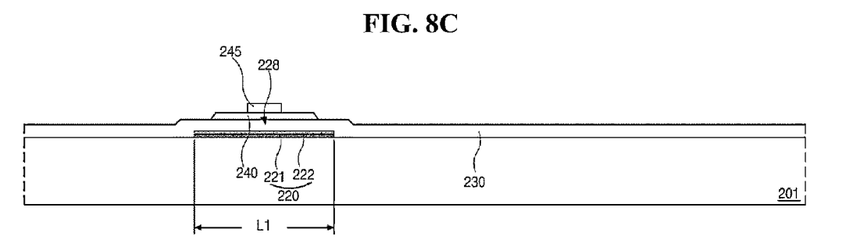

In FIG. 8C, after an insulating material layer of an insulating material is formed on the active layer 240, an etch stopping layer 245 is formed on a central portion of the active layer 240 by patterning the insulating material layer through a photolithographic process.

Although the active layer 240 and the etch stopping layer 245 are formed through twice of photolithographic process in the second embodiment, the active layer and the etch stopping layer may be formed through once of photolithographic process by patterning an oxide semiconductor layer and an insulating material layer on a gate insulating layer using a half transmissive mask in another embodiment.

Figure 8D:
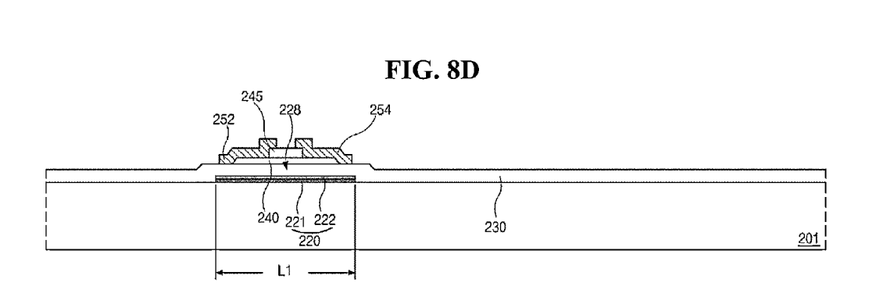

In FIG. 8D, after a second metal layer of a conductive material is formed on the etch stopping layer 245, source and drain electrodes 252 and 254 spaced apart from each other are formed on the etch stopping layer 245 by patterning the second metal layer through a photolithographic process to complete an oxide thin film transistor (TFT). At the same time, a data line (not shown) which crosses the gate line 224 and is connected to the source electrode 252 is formed on the gate insulating layer 230.

Figure 8E:
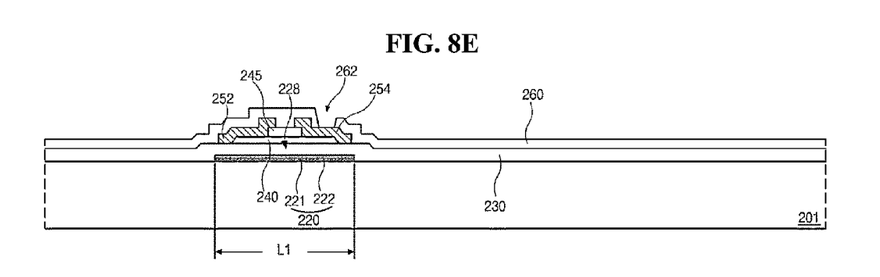

In FIG. 8E, after a passivation layer 260 is formed on the source and drain electrodes 252 and 254 and the data line, a drain contact hole 262 exposing the drain electrode 254 is formed by patterning the passivation layer 260 through a photolithographic process.

Figure 8F:
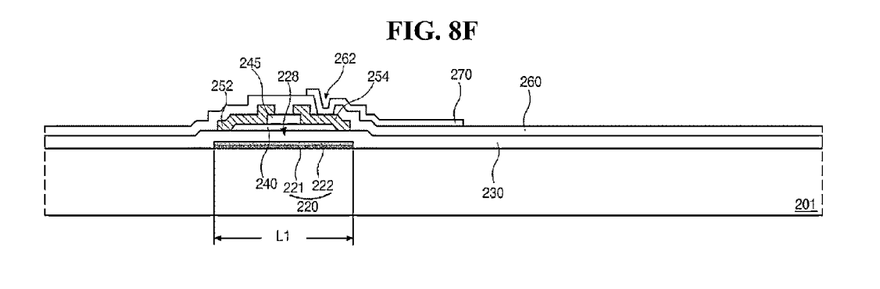

In FIG. 8F, after a transparent conductive material layer is formed on the passivation layer 160, a pixel electrode 270 is formed on the passivation layer 260 by patterning the transparent conductive material layer through a photolithographic process to complete an array substrate. The pixel electrode 270 is connected to the drain electrode 254 through the drain contact hole 262.

The source and drain electrodes may include a barrier layer in another embodiment.

Figure 9:
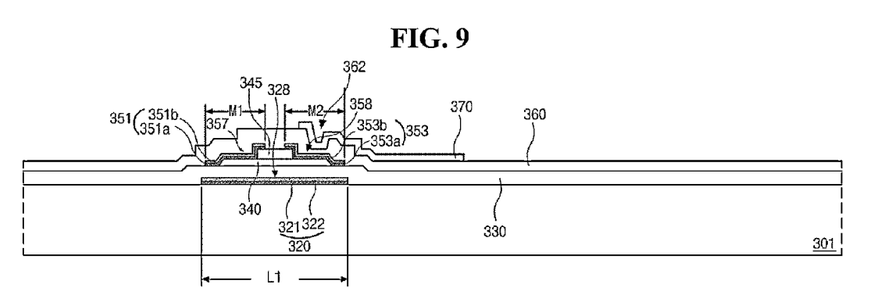
FIG. 9 is a cross-sectional view showing an array substrate according to a third embodiment of the present disclosure.
Figure 10:
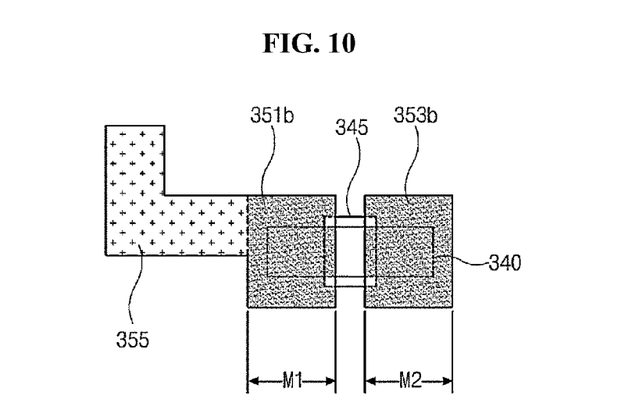
FIG. 10 is a plan view showing an oxide thin film transistor of an array substrate according to a third embodiment of the present disclosure.

FIG. 9 is a cross-sectional view showing an array substrate according to a third embodiment of the present disclosure, and FIG. 10 is a plan view showing an oxide thin film transistor of an array substrate according to a third embodiment of the present disclosure.

In FIGS. 9 and 10, a data barrier layer 351, a drain barrier layer 353 and a data line 355 are formed on a substrate 301 having an active layer 340 and an etch stopping layer 345. The data barrier layer 351 is formed under the data line 355 and in a source electrode region M1, and the drain barrier layer 353 is formed in a drain electrode region M2. The source electrode region M1 and the drain electrode region M2 are spaced apart from each other and correspond to both sides, respectively, of the active layer 340.

The data barrier layer 351 includes first and second data layers 351a and 351b, and the drain barrier layer 353 includes first and second drain layers 353a and 353b. As a result, the second data layer 351b of the data barrier layer 351 is exposed through a source open portion 357 in the source electrode region M1 and the second drain layer 353b of the drain barrier layer 353 is exposed through a drain open portion 358 in the drain electrode region M2.

The method of fabricating a gate barrier layer 320, a gate insulating layer 330, the active layer 340 and the etch stopping layer 345 may be the same as the method of the second embodiment. Next, after third and fourth conductive layers and a second metal layer are sequentially formed on the substrate 301 having the etch stopping layer 345, the third and fourth conductive layers and the second metal layer may be selectively removed through a photolithographic process using a half transmissive mask to form the data barrier layer 351 including the first and second data layers 351a and 351b and the drain barrier layer 353 including the first and second drain layers 353a and 353b. As a result, the source open portion 357 exposing the second data layer 351b of the data barrier layer 351 and the drain open portion 358 exposing the second drain layer 353b of the drain barrier layer 353 are formed.

The third conductive layer for the first data layer 351a and the first drain layer 353a may include a material having a relatively high reflectance. For example, the third conductive layer may be formed of one of molybdenum (Mo), titanium (Ti), copper (Cu), aluminum (Al), gold (Au) and silver (Ag) or an alloy including at least one thereof.

The fourth conductive layer for the second data layer 351b and the second drain layer 353b may include a material having a relatively high etching selectivity with respect to copper (Cu). For example, the second conductive layer may be formed of a transparent conductive oxide (TCO) such as indium oxide (InOx), zinc oxide (ZnOx) and tin oxide (SnOx).

The second metal layer for the data line 355 may include one of aluminum (Al), copper (Cu), gold (Au), silver (Ag), titanium (Ti), chromium (Cr), tungsten (W), tantalum (Ta) and molybdenum (Mo). Alternatively, the first metal layer for the gate line 224 may include an alloy having one of aluminum (Al), copper (Cu), gold (Au), silver (Ag), titanium (Ti), chromium (Cr), tungsten (W), tantalum (Ta) and molybdenum (Mo) and at least one of calcium (Ca), magnesium (Mg), zinc (Zn), titanium (Ti), molybdenum (Mo), nickel (Ni), manganese (Mn), zirconium (Zr), cadmium (Cd), gold (Au), silver (Ag), cobalt (Co), indium (In), tantalum (Ta), hafnium (Hf), tungsten (W) and chromium (Cr).

The data barrier layer 351 and the drain barrier layer 353 may have a single-layered structure or a multiple-layered structure. Although the data barrier layer 351 and the drain barrier layer 353 are formed in the source and drain electrode regions M1 and M2 with the source and drain electrodes omitted in the third embodiment, the source and drain electrodes may be partially formed in the source and drain electrode regions M1 and M2 in another embodiment. For example, the source and drain electrodes may be disposed at an edge portion of the source and drain electrode regions M1 and M2.

Although the oxide TFT includes an active layer of an oxide semiconductor material in the first to third embodiments, the oxide TFT may include an active layer of one of an amorphous oxide semiconductor (AOS) material of silicon, amorphous oxide material, graphene and organic semiconductor material. For example, the organic semiconductor material may include pentacene, tetracene, anthracene, naphthalene, α-6-thiophene, α-5-thiophene, α-4-thiophene, perylene and its derivatives, rubrene and its derivatives, coronene and its derivatives, perylenetetracarboxylic diimide and its derivatives, perylenetetracarboxylic dianhydride and its derivatives, polythiophenes (PT) and its derivatives, poly-p-phenylene vinylene (PPV) and its derivatives, polyfluorenes (PFs) and its derivatives, polythiophenes vinylene and its derivatives, polythiophenes-heterocyclic compound copolymer and its derivatives, phthalocyanine and its derivatives, pyromellitic dianhydride and its derivatives, and pyromellitic diimide and its derivatives.

The array substrate including the oxide TFT according to the present disclosure may be applied to one of a vertical alignment (VA) mode LCD device where liquid crystal molecules are driven by a vertical electric field generated between two substrates, an in-plane switching (IPS) mode LCD device where liquid crystal molecules are driven by a horizontal electric field generated between a pixel electrode and a common electrode on one substrate, a fringe field switching (FFS) mode LCD device where a horizontal electric field generated between a pixel electrode and a common electrode in different layers on one substrate and an OLED display device.

Consequently, in an array substrate including an oxide TFT and a method of fabricating the array substrate according to the present disclosure, since a gate electrode includes a gate open portion and a gate barrier layer is exposed through the gate open portion, the gate barrier layer functions as the gate electrode and grain growth and cavity formation in the gate electrode are prevented. In addition, since source and drain electrodes are removed and a data barrier layer and a drain barrier layer are exposed through a source open portion and a drain open portion, respectively, the data barrier layer and the drain barrier layer function as the source and drain electrodes, respectively, and grain growth and cavity formation in the source and drain electrodes are prevented. As a result, reliability is improved and deterioration is prevented.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An array substrate comprising:
   a gate barrier layer on a substrate;
   a gate line on the gate barrier layer, at least part of the gate line being discontinuous exposing the gate barrier layer in a gate electrode region;
   a gate insulating layer on the gate line;
   an active layer on the gate insulating layer over the gate barrier layer in the gate electrode region; and
   a source electrode and a drain electrode spaced apart from each other on the active layer,
   wherein the discontinuous part of the gate line is positioned under a region in the active layer between the source electrode and the drain electrode.

2. The array substrate of claim 1, wherein the gate barrier layer includes one of:
   an alloy including at least two of chromium (Cr), silicon (Si), titanium (Ti), molybdenum (Mo), tantalum (Ta) and aluminum (Al); and
   a material including one of chromium (Cr), silicon (Si), titanium (Ti), molybdenum (Mo), tantalum (Ta) and aluminum (Al) and one of carbon oxide (COx), oxide (Ox) and nitride (Nx).

3. The array substrate of claim 1, wherein the gate barrier layer includes a first gate layer and a second gate layer on the first gate layer, wherein a reflectance of the first gate layer is higher than a reflectance of the second gate layer, and wherein an etching resistance of the second gate layer with respect to the gate line is higher than an etching resistance of the first gate layer with respect to the gate line.

4. The array substrate of claim 3, wherein the first gate layer includes one of molybdenum (Mo), titanium (Ti), copper (Cu), aluminum (Al), gold (Au) and silver (Ag) and an alloy including at least one thereof, and wherein the second gate layer includes one of indium oxide (InOx), zinc oxide (ZnOx) and tin oxide (SnOx).

5. The array substrate of claim 3, wherein the gate barrier layer further includes a third gate layer under the first gate layer, and wherein the third gate layer includes one of indium oxide (InOx), zinc oxide (ZnOx) and tin oxide (SnOx).

6. The array substrate of claim 1, further comprising a gate electrode at a periphery of the gate electrode region.

7. The array substrate of claim 1, wherein:
   the source electrode includes a first data layer and a second data layer on the first data layer, wherein a reflectance of the first data layer is higher than a reflectance of the second data layer, wherein an etching resistance of the second data layer with respect to the gate line is higher than an etching resistance of the first data layer with respect to the gate line; and
   the drain electrode includes a first drain layer and a second drain layer on the first drain layer, wherein a reflectance of the first drain layer is higher than a reflectance of the second drain layer, and wherein an etching resistance of the second drain layer with respect to the gate line is higher than an etching resistance of the first drain layer with respect to the gate line.

8. The array substrate of claim 7, wherein each of the first data layer and the first drain layer includes one of molybdenum (Mo), titanium (Ti), copper (Cu), aluminum (Al), gold (Au) and silver (Ag) and an alloy including at least one thereof, and wherein each of the second data layer and the second drain layer includes one of indium oxide (InOx), zinc oxide (ZnOx) and tin oxide (SnOx).

9. The array substrate of claim 7, wherein the source electrode further includes a third data layer under the first data layer, wherein the drain electrode further includes a third drain layer under the first drain layer, and wherein each of the third data layer and the third drain layer includes one of indium oxide (InOx), zinc oxide (ZnOx) and tin oxide (SnOx).

10. The array substrate of claim 1, wherein each of the gate line, the source electrode and the drain electrode includes an alloy having one of aluminum (Al), copper (Cu), silver (Ag) and titanium (Ti) and at least one of calcium (Ca), magnesium (Mg), zinc (Zn), titanium (Ti), molybdenum (Mo), nickel (Ni), manganese (Mn), zirconium (Zr), cadmium (Cd), gold (Au), silver (Ag), cobalt (Co), indium (In), tantalum (Ta), hafnium (Hf), tungsten (W) and chromium (Cr).

* * * * *